(12) United States Patent
Hornemann et al.

(10) Patent No.: US 7,282,807 B2
(45) Date of Patent: Oct. 16, 2007

(54) SYSTEMS AND METHODS FOR TESTING A WIND TURBINE

(75) Inventors: Michael Ulfert Hornemann, Bozeman, MT (US); Steven Galloway, Tehachapi, CA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/312,193

(22) Filed: Dec. 20, 2005
(Under 37 CFR 1.47)

(65) Prior Publication Data

US 2007/0138796 A1    Jun. 21, 2007

(51) Int. Cl.
*H02P 9/04* (2006.01)

(52) U.S. Cl. .......................................... 290/44; 290/55

(58) Field of Classification Search ................ 290/44
See application file for complete search history.

(56) References Cited

U.S. PATENT DOCUMENTS

| | | | | |
|---|---|---|---|---|
| 2,775,119 A | * | 12/1956 | Kirby | ................... 73/862.17 |
| 2,868,932 A | * | 1/1959 | Schonhoff et al. | ............ 338/56 |
| 4,039,854 A | * | 8/1977 | Elliott et al. | ................. 307/118 |
| 4,445,047 A | * | 4/1984 | Cannon | ........................ 307/31 |
| 5,416,416 A | * | 5/1995 | Bisher | ........................ 324/426 |
| 5,565,716 A | * | 10/1996 | Tierney, Jr. | ................. 307/154 |
| 5,583,440 A | * | 12/1996 | Bisher | ........................ 324/426 |
| 6,078,171 A | * | 6/2000 | Kondoh | ...................... 323/354 |
| 6,420,796 B1 | | 7/2002 | Lagerwey | |
| 6,653,928 B1 | * | 11/2003 | Kondo | ........................ 338/319 |
| 6,833,636 B1 | * | 12/2004 | Nestel et al. | ................ 307/154 |
| 7,045,913 B2 | * | 5/2006 | Ebrahim et al. | ............... 290/52 |
| 2003/0227172 A1 | | 12/2003 | Erdman et al. | |
| 2005/0077881 A1 | * | 4/2005 | Capp et al. | .................... 322/29 |
| 2005/0134248 A1 | * | 6/2005 | Locker et al. | ............... 323/285 |
| 2006/0060396 A1 | * | 3/2006 | Rozman | ..................... 180/65.1 |
| 2007/0035135 A1 | * | 2/2007 | Yoshida | ........................ 290/44 |

FOREIGN PATENT DOCUMENTS

JP            03068106 A    *  3/1991

* cited by examiner

*Primary Examiner*—Joseph Waks
(74) *Attorney, Agent, or Firm*—James E. McGinness; Armstrong Teasdale LLP

(57) ABSTRACT

A system for testing is described. The system includes a wind turbine, a grid generator configured to generate power and coupled to the wind turbine, and a portable load coupled to the grid generator.

20 Claims, 10 Drawing Sheets

# SYSTEMS AND METHODS FOR TESTING A WIND TURBINE

BACKGROUND OF THE INVENTION

This invention relates generally to wind turbines and more particularly to systems and methods for testing power production capability of a wind turbine.

A wind turbine is tested by using a point of interaction (POI) substation before supplying the wind turbine to a customer. However, if the POI substation is not constructed or not energized before a certain deadline, the wind turbine cannot be tested in due time and a late delivery charge is due to a customer. Moreover, if the POI substation is constructed and energized close to a due date for delivering the wind turbine to the customer, a time crunch and therefore, an inconvenience is created.

BRIEF DESCRIPTION OF THE INVENTION

In one aspect, a system for testing is described. The system includes a wind turbine, a grid generator configured to generate power and coupled to the wind turbine, and a portable load coupled to the grid generator.

In another aspect, a system for testing is described. The system includes a wind turbine, a portable generator configured to generate power and coupled to the wind turbine, and a portable load coupled to the generator.

In yet another aspect, a method for testing is described. The method includes coupling a grid generator to a wind turbine, and coupling a portable load to the grid generator.

DETAILED DESCRIPTION OF THE INVENTION

Figure 1:
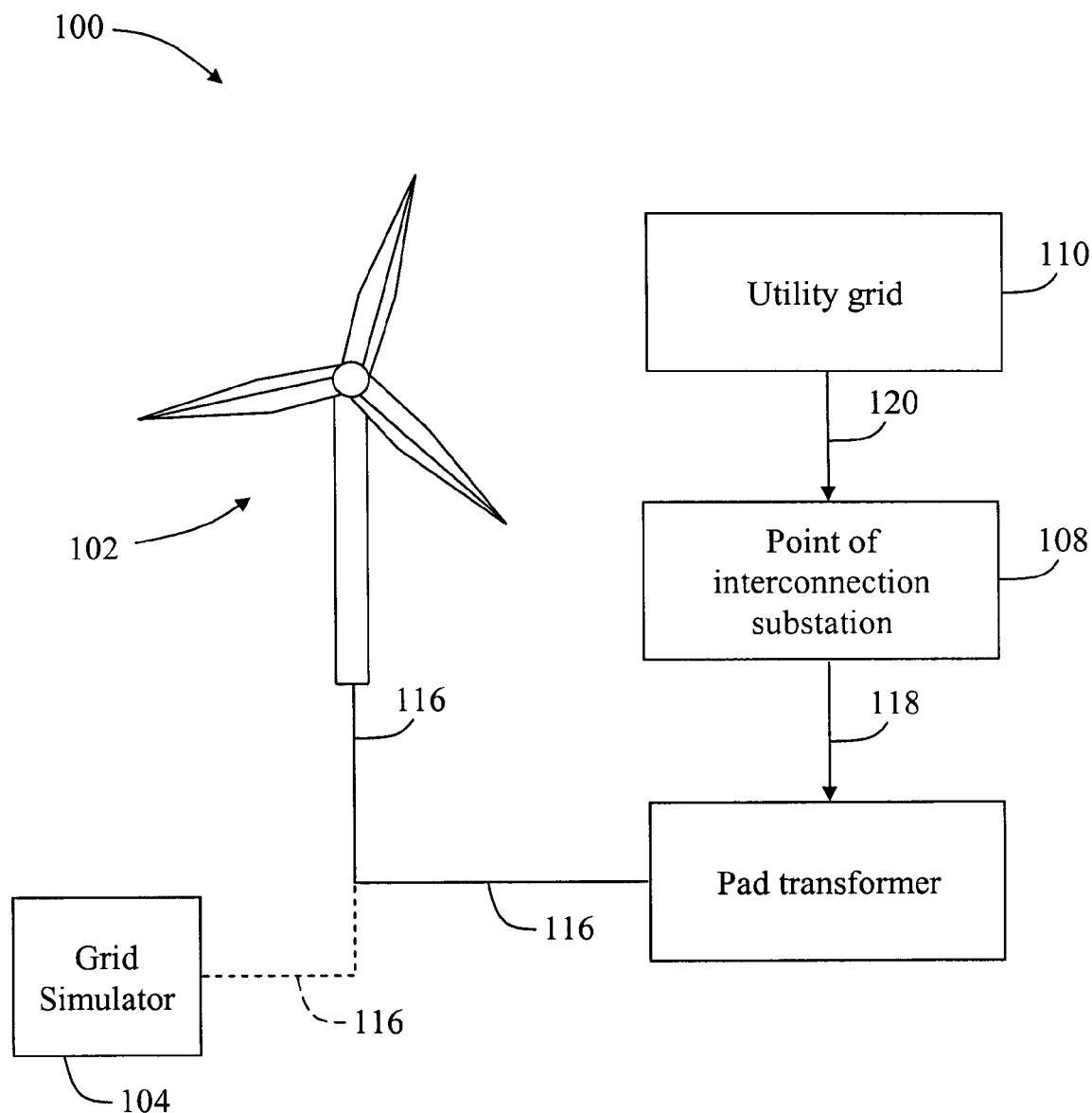
FIG. 1 is a block diagram of an embodiment of a system for testing a wind turbine.

FIG. 1 is a block diagram of an embodiment of a system 100 for testing a wind turbine. System 100 includes a wind turbine 102, a grid simulator 104, a pad transformer 106, a point of interconnection (POI) substation 108, and a utility grid 110. Wind turbine 102 may output 1.5 megawatt (MW) of power, Alternatively, wind turbine 102 may output 2.3, 2.5, 2.7, or alternatively 3.6 MW of power. Pad transformer 106 can have a secondary winding at 575 volts alternating current (VAC) and a primary winding at 12 kilovolt alternating current (kVAC), and utilizes a power of 1.75 megavolt amperes (MVA). Alternatively, pad transformer 106 can have a primary winding at 34.5 kVAC and a secondary winding at 575 VAC, and utilizes a power of 1.75 MVA. Utility grid 110 may be a plurality of businesses or homes that utilize power from wind turbine 102. In an alternative embodiment, a plurality of wind turbines are coupled to utility grid 110 in a similar manner in which wind turbine 102 is coupled with utility grid 110. For example, another wind turbine 102 is coupled via a pad transformer and POI substation 108 to utility grid 110.

Wind turbine 102 generates a wind turbine output signal 116 that is supplied to pad transformer 106. Pad transformer 106 receives wind turbine output signal 116 and converts wind turbine output signal 116 from a low voltage to a voltage that is higher than the low voltage to generate a pad transformer output signal 118. POI substation 108 receives pad transformer output signal 118 and converts pad transformer output signal 118 from a low voltage to a voltage that is higher than the low voltage and that is compatible with utility grid 110 to generate a substation output signal 120. POI substation 108 supplies power to utility grid 110 in the form of substation output signal 120.

A user disconnects wind turbine 102 from pad transformer 106 and couples wind turbine 102 to grid simulator 104 to test wind turbine 102. Wind turbine 102 is tested by using grid simulator 104 and by receiving wind turbine output signal 116.

Figure 2:
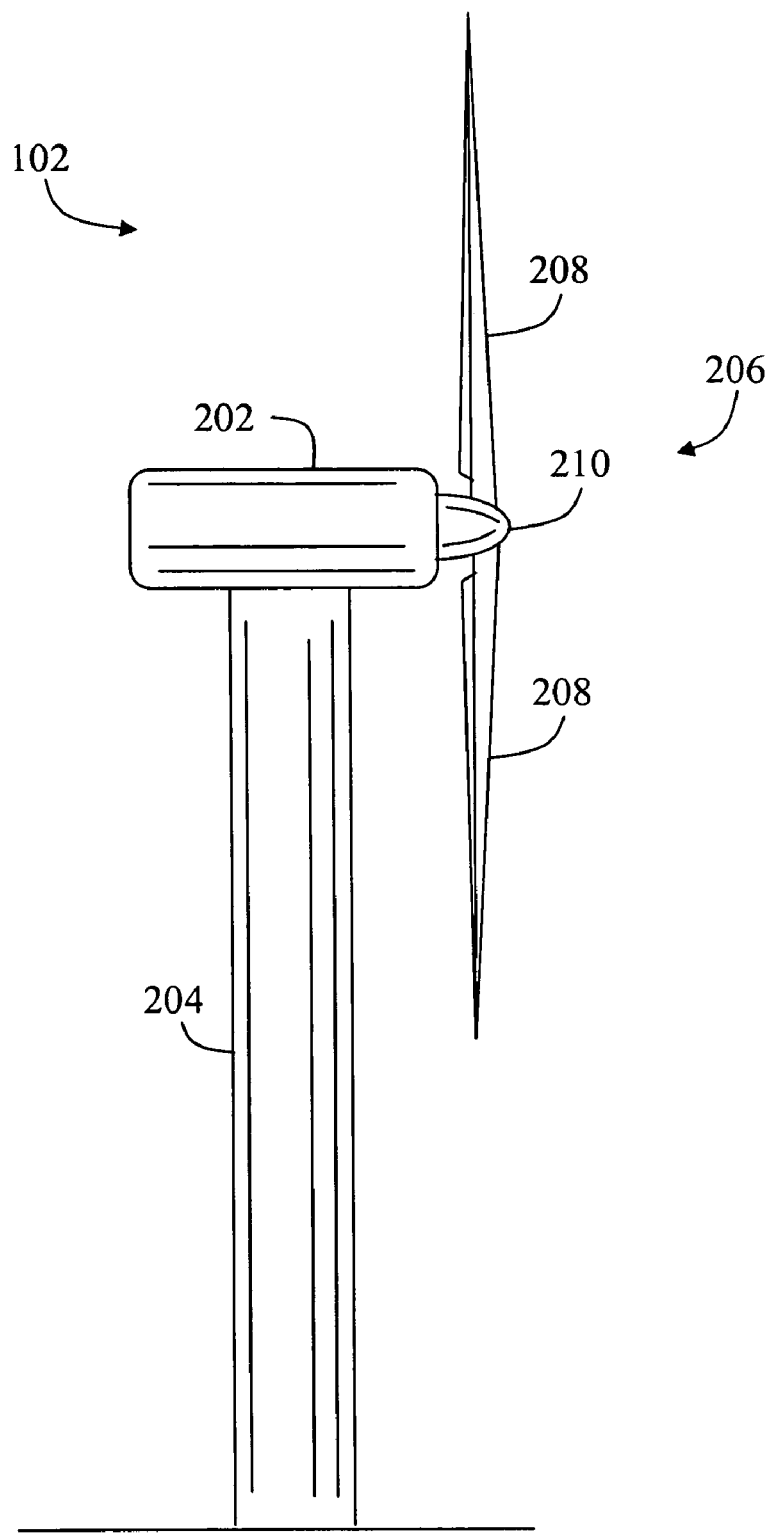
FIG. 2 is a diagram of an embodiment of a wind turbine used within the system of FIG. 1.

FIG. 2 is a diagram of an embodiment of wind turbine 102 including a nacelle 202, a tower 204, a rotor 206 having at least two rotor blades 208 and a rotating hub 210. Nacelle 202 is mounted atop tower 204. Rotor blades 208 are attached to hub 210.

Figure 3:
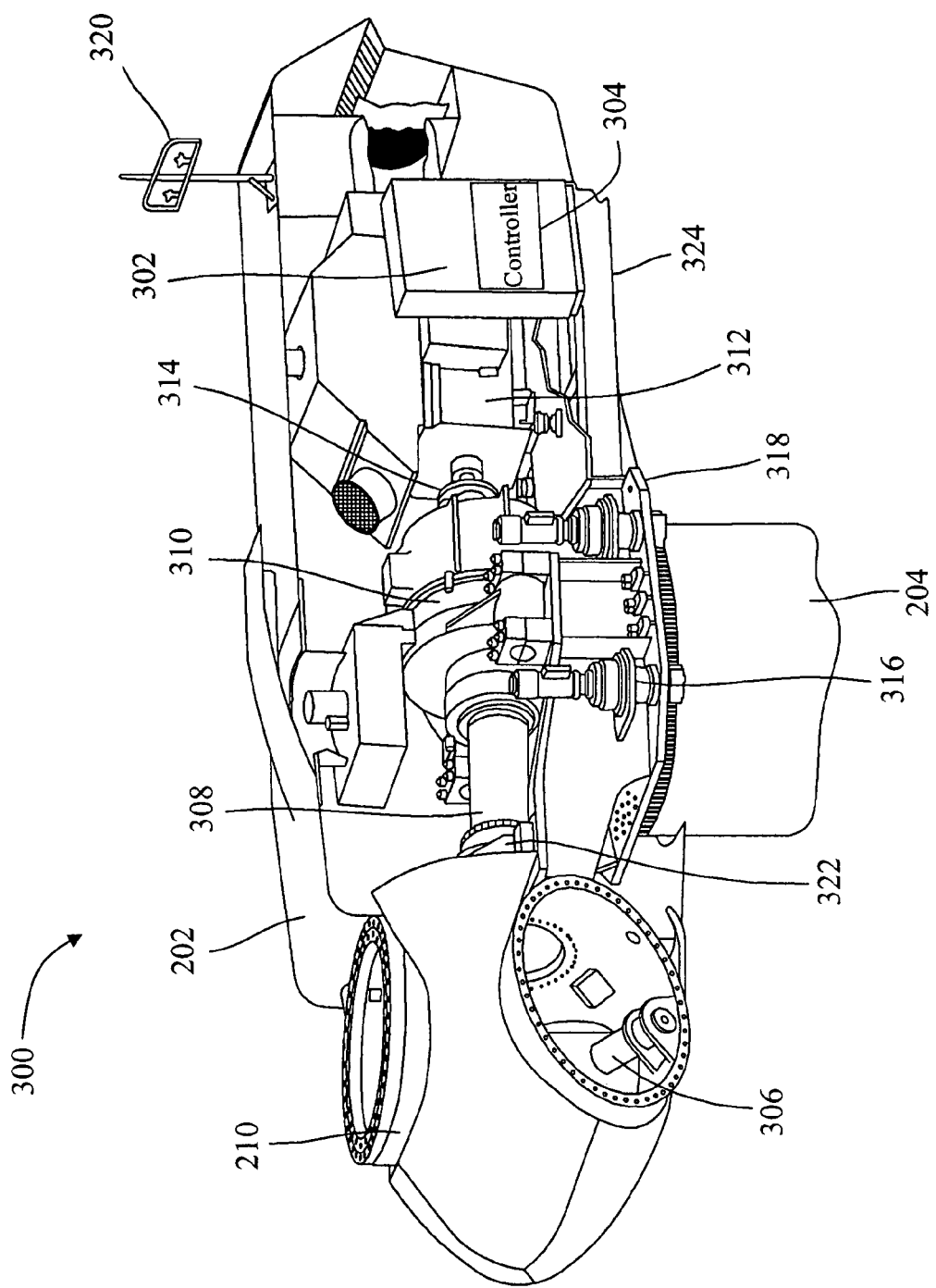
FIG. 3 is a diagram of an embodiment of a system including a nacelle, a tower, and a hub of the wind turbine of FIG. 2.

FIG. 3 is a diagram of an embodiment of a system 300 including nacelle 202, tower 204, and hub 210. Nacelle 202 houses a control panel 302 including a controller 304. In an alternative embodiment, controller 304 is located within a main control cabinet at a base of tower 204. As used herein, the term controller is not limited to just those integrated circuits referred to in the art as a controller, but broadly refers to a processor, a microcontroller, a microcomputer, a programmable logic controller, an application specific integrated circuit, and any other programmable circuit.

Hub 210 includes a variable blade pitch drive 306. Nacelle 202 also houses a portion of a main rotor shaft 308, a gear box 310, a wind turbine generator 312, and a coupling 314. A yaw drive 316 and a yaw deck 318 are housed within nacelle 202. A metrological boom 320 is coupled to nacelle 202. Nacelle 202 further houses a main bearing 322 and a main frame 324. Controller 304 controls rotor 206 and components housed within nacelle 202.

Variable blade pitch drive 306 is provided to control a pitch of blades 208 that drive hub 210 as a result of wind. In an alternative embodiment, a plurality of pitches of blades 208 are individually controlled by blade pitch drive 306.

Main rotor shaft 308, which is a low speed shaft, is connected to hub 210 via main bearing 322 and is connected at an opposite end of main rotor shaft 308 to gear box 310. Main rotor shaft 308 rotates with a rotation of hub 210. Gear box 310 utilizes a dual path geometry to drive an enclosed high speed shaft. The high speed shaft is coupled to main rotor shaft 308 and rotates with a rotation of main rotor shaft 308. The high speed shaft operates at a higher speed than main rotor shaft 308. Alternatively, main rotor shaft 308 is coupled directly to wind turbine generator 312. The high speed shaft is used to drive wind turbine generator 312, which is mounted on main frame 324. A torque of rotor 206 is transmitted via main rotor shaft 308, the high speed shaft, gear box 310, and coupling 314 to wind turbine generator 312 that generates wind turbine output signal 116.

Yaw drive 316 and yaw deck 318 provide a yaw orientation system for wind turbine 102. Meteorological boom 320 provides information for controller 304 in control panel 302, and the information includes wind direction and/or wind speed.

Figure 4:
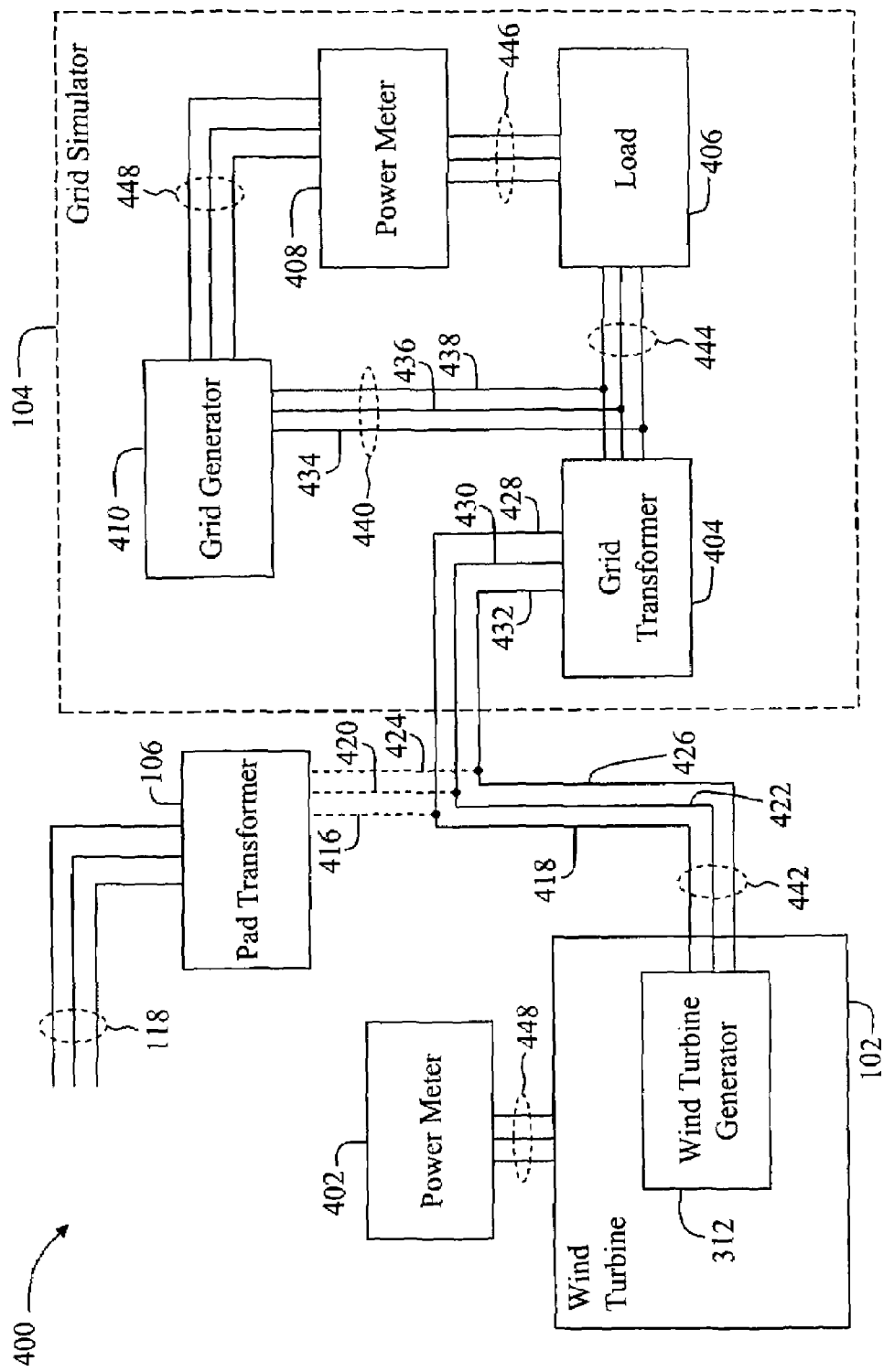
FIG. 4 is a block diagram of an embodiment of a system for testing the wind turbine of FIG. 2.
Figure 5:
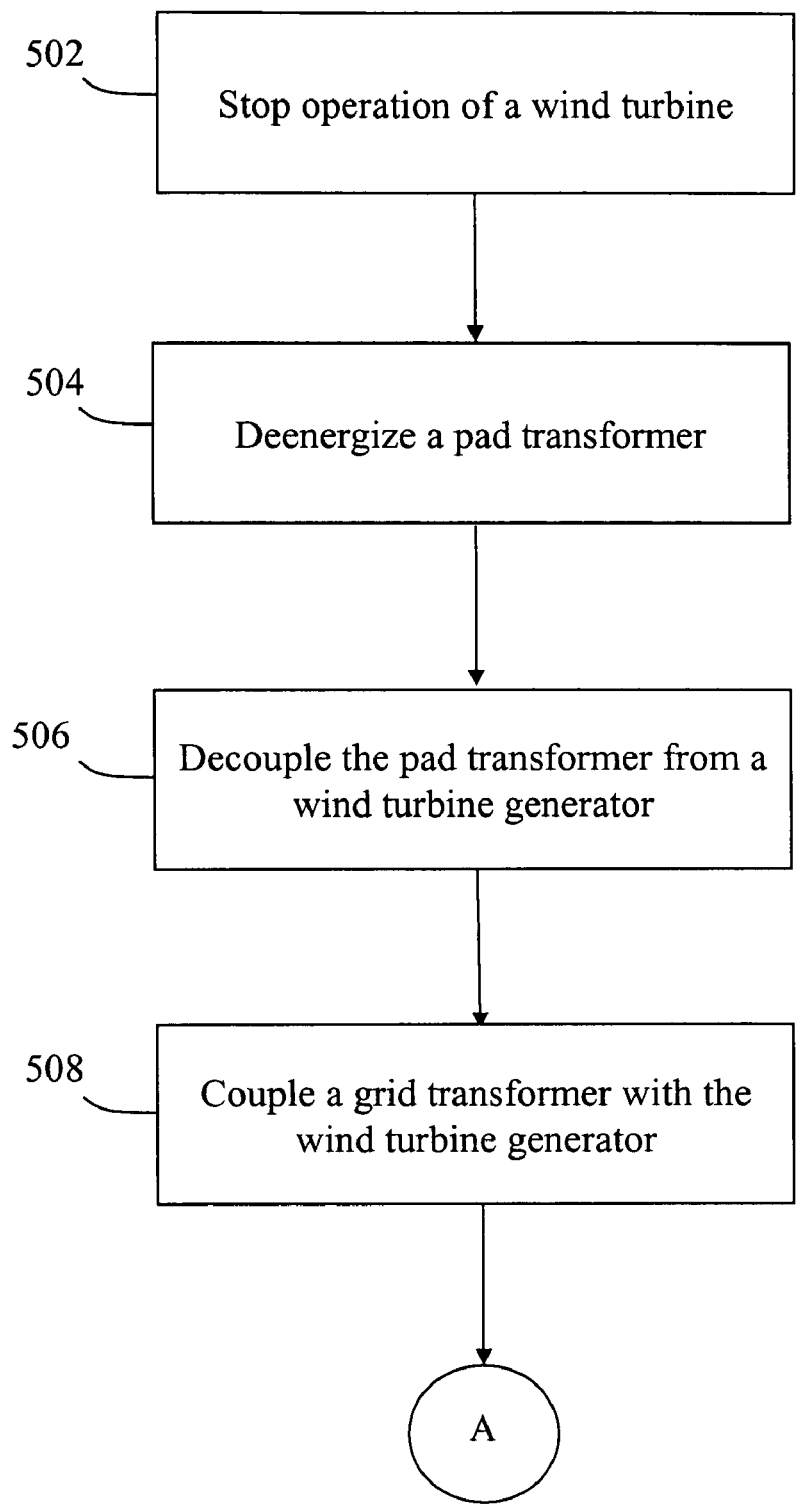
FIG. 5 is a flowchart of an embodiment of a method for testing the wind turbine of FIG. 2.
Figure 6:
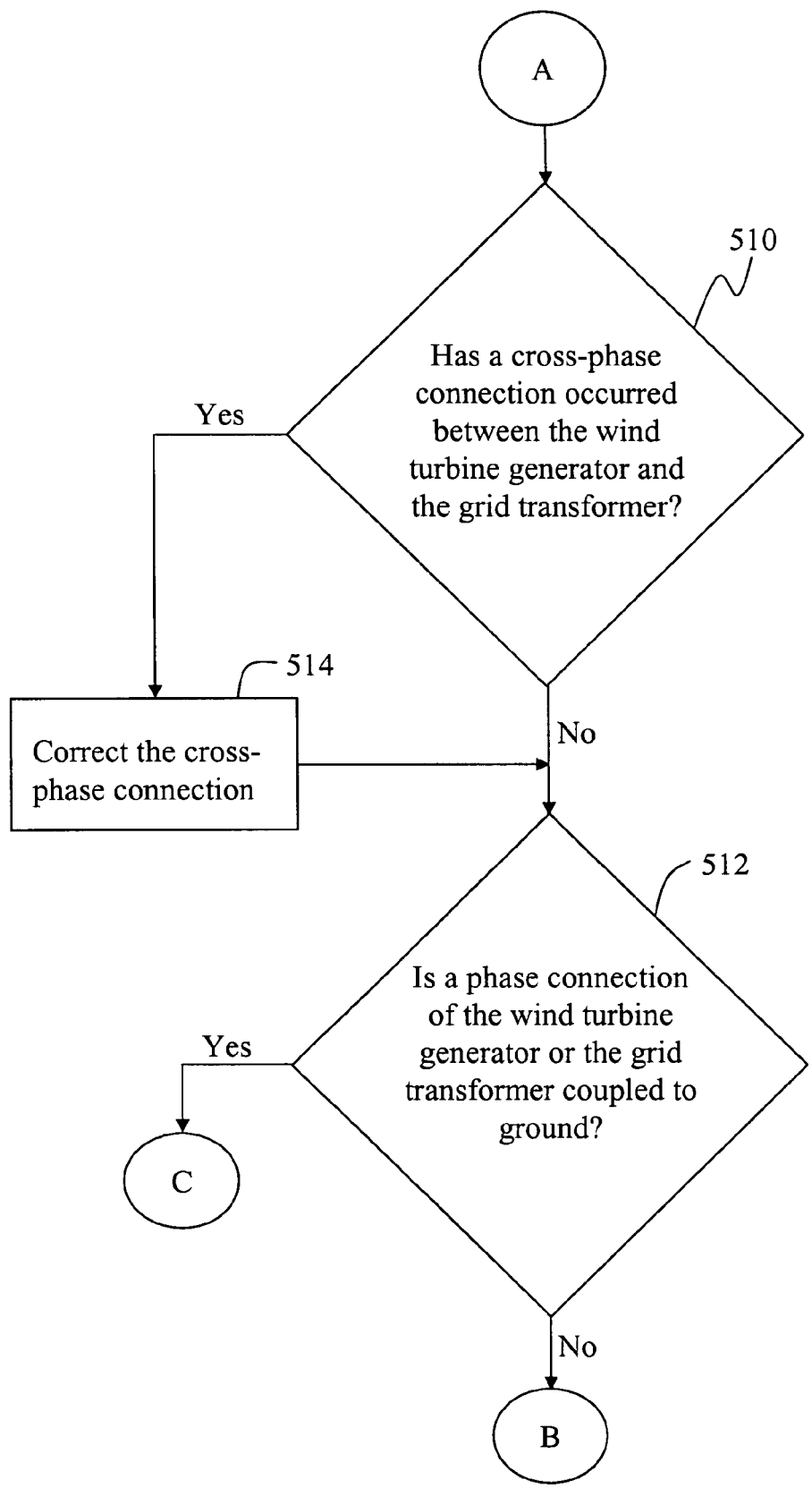
FIG. 6 is a continuation of the flowchart of FIG. 5.
Figure 7:
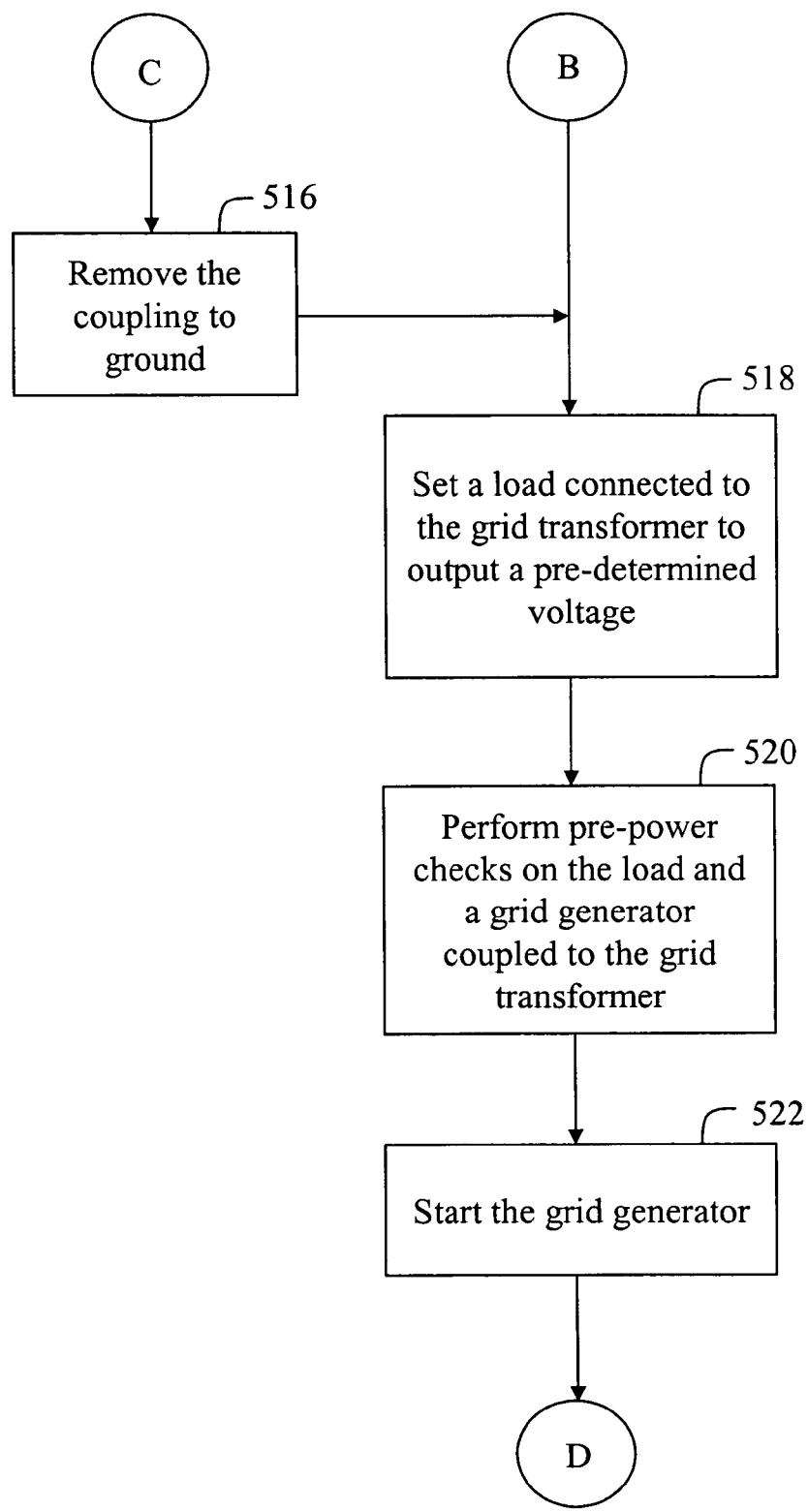
FIG. 7 is a continuation of the flowchart of FIG. 6.
Figure 8:
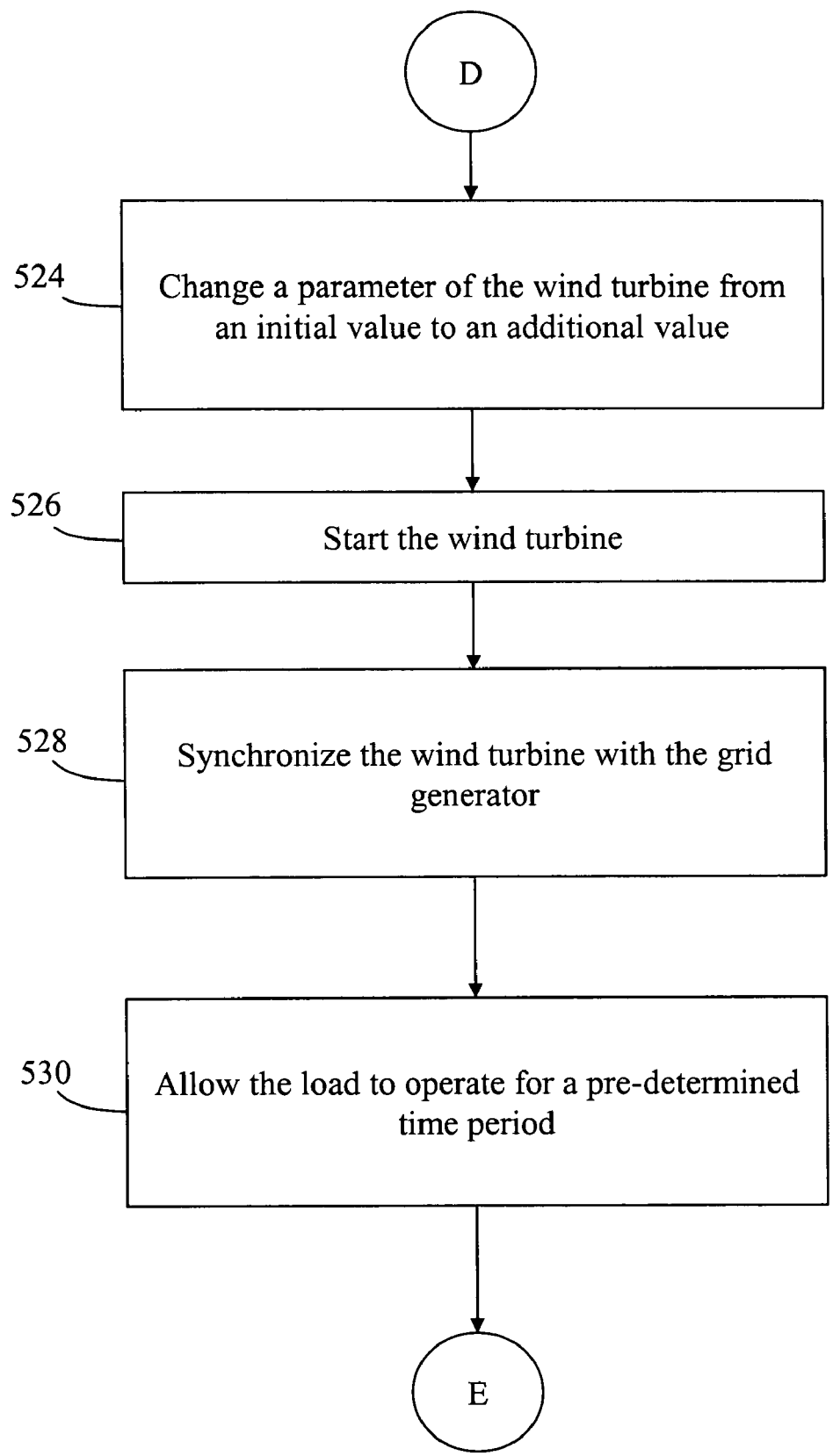
FIG. 8 is a continuation of the flowchart of FIG. 7.
Figure 9:
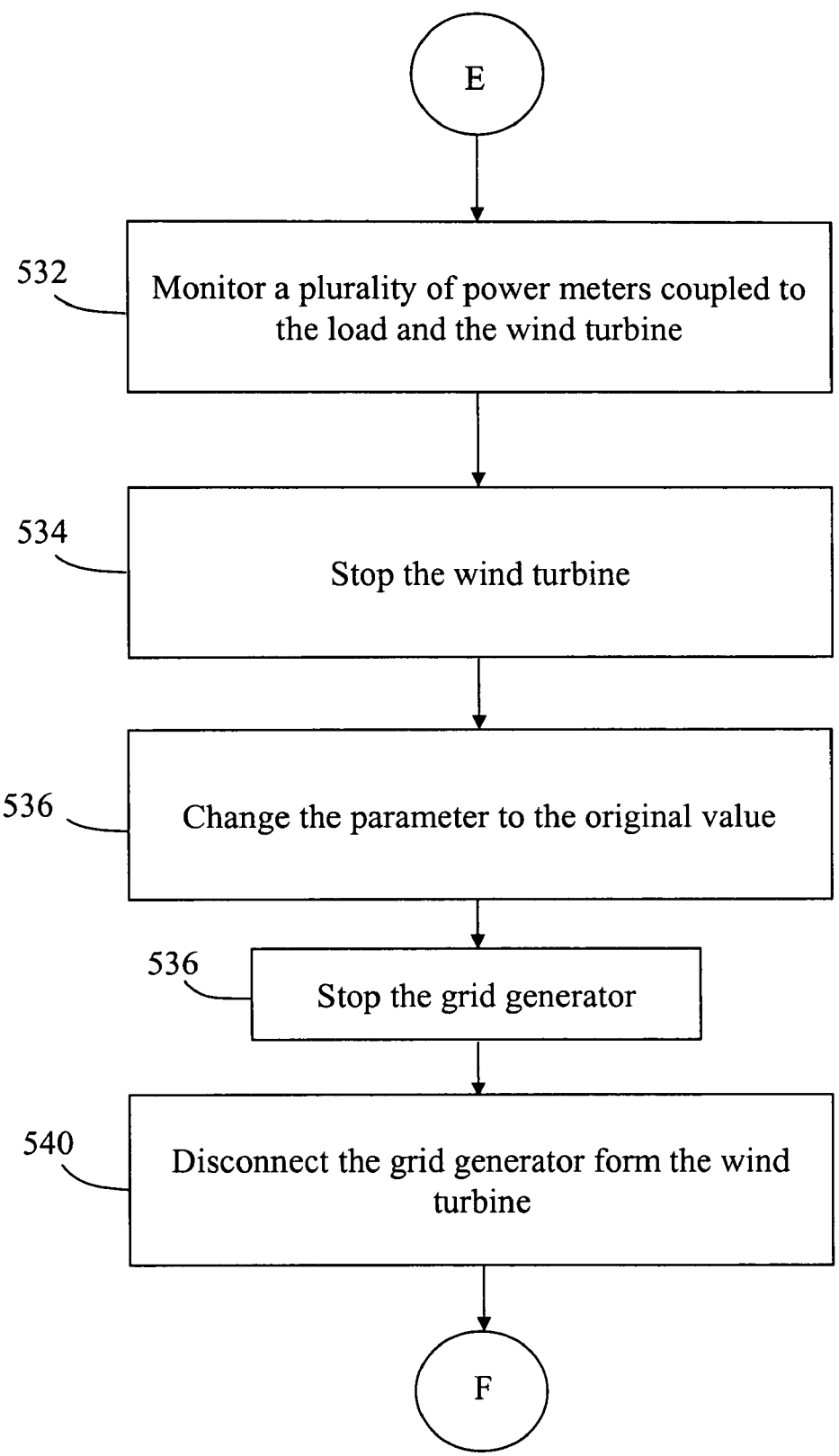
FIG. 9 is a continuation of the flowchart of FIG. 8.
Figure 10:
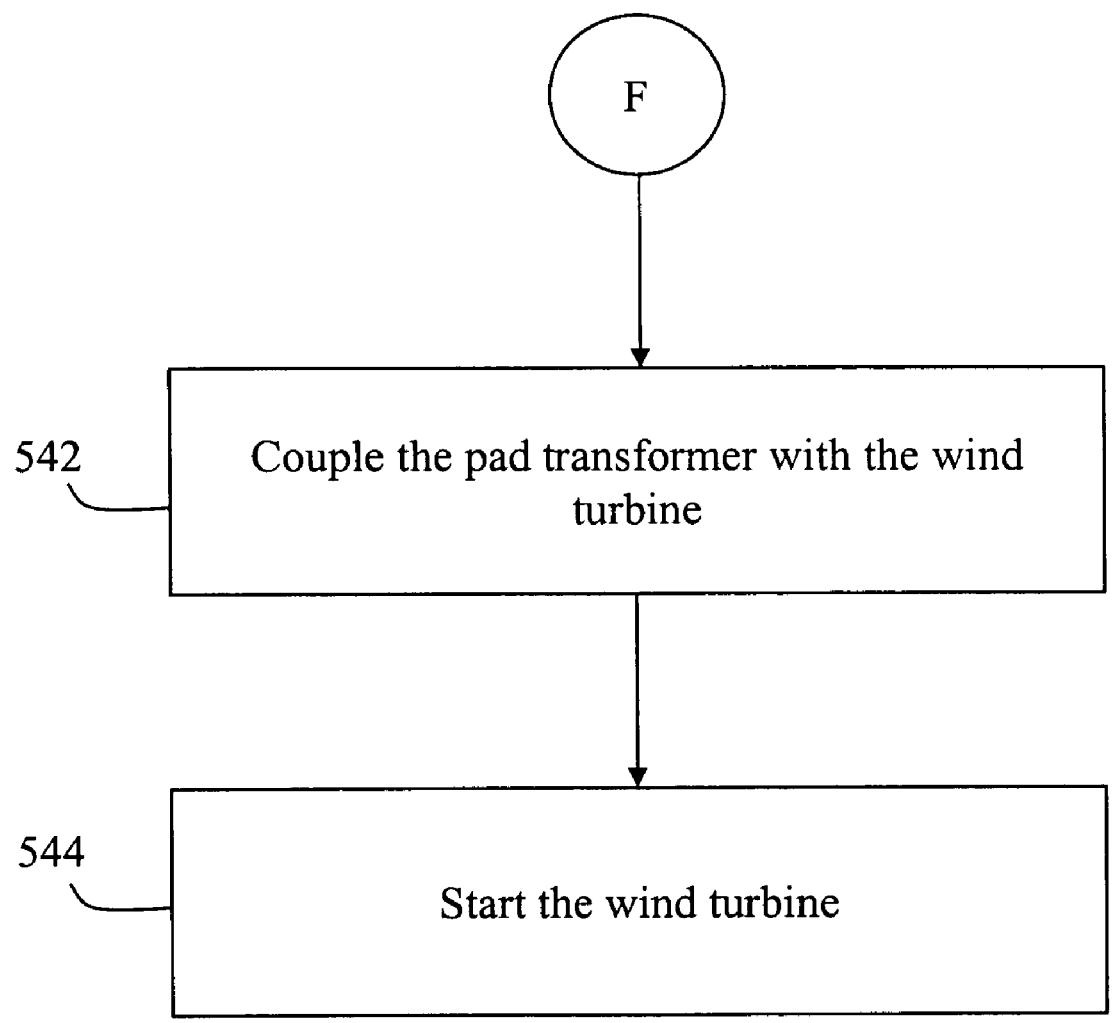
FIG. 10 is a continuation of the flowchart of FIG. 9.

FIG. 4 is a block diagram of an embodiment of a system 400 for testing a wind turbine and FIGS. 5-10 is a flowchart of an embodiment of a method for testing a wind turbine. The methods illustrated in FIGS. 5-10, in some instances, may be performed sequentially, in parallel, or in an order other than that which is described. It should be appreciated that not all of the methods described are required to be performed, that additional methods may be added, and that some of the illustrated methods may be substituted with other methods.

System 400 includes pad transformer 106, a power meter 402, wind turbine 102, and grid simulator 104. Grid simulator 104 includes a grid transformer 404, a load 406, a power meter 408, and a grid generator 410. Load 406 can be a plurality of heaters, such as at least one bank of resistors. An example of load 406 includes two heaters available from General Electric™ Energy Rentals Company, where each heater includes a bank of resistors and utilizes a power of 150 kilowatts (kW). As another example, load 406 includes two heaters, where each heater utilizes a power ranging from and including 25 kW to 150 kW. Each of power meters 402 and 408 measure power in kW. Grid generator 410 can be a diesel generator having an operating output ranging from and including 320 kW to 560 kW, and outputting a nominal VAC ranging from and including 480 to 690. Alternatively grid generator 410 can be any generator that operates uses other kinds of fuel, such as gas. Grid generator 410 includes a voltage regulator and a power factor control device. Grid generator 410 is available as model number MMG320GE from Marathon Electric™ Manufacturing Company. Grid transformer 404 may utilize a power of 400 kilovolt amperes (kVA), has a primary winding operating at 480 VAC, and a secondary winding operating at 575 VAC. Grid transformer 404 is available as model number TMT400B26 from Temco Transformer™ Company.

Grid simulator 104 is portable and can be transported on a trailer, such as a flatbed trailer ranging from and including 40 feet in length to 48 feet in length. For example, grid simulator 104 is transported to a location of wind turbine 102 and coupled to wind turbine 102. The trailer is attached to a vehicle, such as a truck, that transports grid simulator 104. In an alternative embodiment, grid simulator 104 includes a circuit breaker that is coupled between wind turbine generator 312 and grid transformer 404. The circuit breaker has a maximum capacity of 400 amperes (A). The circuit breaker prevents overloading by wind turbine output signal 116 when a current of wind turbine output signal 116 exceeds a current at which load 406 is set of operate.

A user stops 502 wind turbine 102 from operating by changing a pitch of rotor blades 208 to an angle, such as 90 degrees, and then applying a brake to main rotor shaft 308. For example, the user operates controller 304 and controller 304 sends a signal to blade pitch drive 306 that drives rotor blades 208 to change a pitch of rotor blades 208 to 90 degrees. In an alternative embodiment, the user stops 502 wind turbine 102 from operating by changing a pitch of rotor blades 208 to an angle, such as 90 degrees, without applying a brake to main rotor shaft 308. In another alternative embodiment, wind turbine 102 automatically stops 502 if wind turbine 102 is disconnected from utility grid 110.

The user deenergizes 504 pad transformer 106 by removing a supply of power to pad transformer 106. Alternatively, pad transformer 106 is automatically deenergized 504 if POI substation is not constructed or not energized. The user decouples 506 pad transformer 106 from wind turbine generator 312. For example, a single-phase connection 416 of a primary winding of pad transformer 106 is disconnected by the user from a single-phase connection 418 of wind turbine generator 312, a single-phase connection 420 of the primary winding of pad transformer 106 is disconnected by the user from a single-phase connection 422 of wind turbine generator 312, a single-phase connection 424 of the primary winding of pad transformer 106 is disconnected by the user from a single-phase connection 426 of wind turbine generator 312, and a ground connection of the primary winding of pad transformer 106 is disconnected by the user from a ground connection of wind turbine generator 312 to decouple pad transformer 106 from wind turbine generator 312.

The user couples 508 grid transformer 404 with wind turbine generator 312. For example, a single-phase connection 428 of a primary winding of grid transformer 404 is connected by the user to single-phase connection 418 of wind turbine generator 312, a single-phase connection 430 of the primary winding of grid transformer 404 is connected by the user to single-phase connection 422 of wind turbine generator 312, a single-phase connection 432 of the primary winding of grid transformer 404 is connected by the user to single-phase connection 426 of wind turbine generator 312, and a ground connection of the primary winding of grid transformer 404 is connected by the user with a ground connection of wind turbine generator 312 to couple grid transformer 404 with wind turbine generator 312.

The user verifies 510 whether a cross-phase connection has occurred between grid transformer 404 and wind turbine generator 312 and whether 512 any of single-phase connections 418, 422, 426, 428, 430, and 432 are coupled to ground. For example, the user determines whether a 120 degree phase connection of grid transformer 404 is coupled to a 240 degree phase of wind turbine generator 312 and that single-phase connection 432 of grid transformer 404 is coupled to a ground connection of wind turbine generator 312. If there is cross-phase connection between grid transformer 404 and wind turbine generator 312, the user corrects 514 the cross-phase connection. For example, the user connects a 120 degree phase connection of grid transformer 404 to a 120 degree phase connection of wind turbine generator 312. Moreover, the user removes 516 a coupling 314 between a ground connection and any of single-phase connections 418, 422, 426, 428, 430, and 432.

The user sets 518 load 406 to operate at or output a pre-determined power, such as ranging from and including 250 kW to 300 kW. For example, the user couples a plurality of resistors within a first bank in series to generate half of the pre-determined power, couples a plurality of resistors within a second bank in series to generate half of the pre-determined power, and couples the first and second banks in series to generate the pre-determined power.

The user performs 520 pre-power checks on grid generator 410 and load 406. For example, the user checks whether grid generator 410 has fuel, such as diesel or gas, has oil, or has an anti-freeze. As another example, the user controls the voltage regulator and power factor control device so that grid generator 410 outputs a voltage ranging from and including 470 VAC to 490 VAC. As another example, the user checks whether a plurality of resistors within a first bank are coupled to each other to output 150 kW of heat and whether a plurality of resistors within a second bank are coupled to each other to output 150 kW of heat.

The user starts 522 grid generator 410 by turning on a switch of generator. The user also changes 524 a parameter of wind turbine 102 from an initial value to an additional value to limit a power output of wind turbine generator 312 to a value of 100 kW. For example, the user inputs into controller 304 a frequency, having the additional value, of rotation of a rotor within wind turbine generator 312. Controller 304 supplies a signal to the rotor to rotate at the frequency, having the additional value, input by the user. As another example, the user changes a pitch of rotor blades 208 to the additional value by providing the additional value to controller 304. Controller 304 sends a signal with the additional value to blade pitch drive 306 and blade pitch drive 306 drives rotor blades 208 to change a pitch of rotor blades 208 to the additional value, such as, ranging from and including 20 degrees to 50 degrees.

The user starts 526 wind turbine 102. As an example, the user starts 526 wind turbine 102 by releasing a brake from main shaft and changing a pitch of rotor blades 208. As another example, the user starts 526 wind turbine 102 by changing a pitch of rotor blades 208. The user changes a pitch of rotor blades 208 by inputting into controller 304 a pitch, such as, ranging from and including 20 degrees to 30 degrees. Controller 304 sends a signal to blade pitch drive 306 to drive rotor blades 208 at a pitch, such as, ranging from and including 20 degrees to 30 degrees. Wind turbine 102 starts and the rotor within wind turbine generator 312 rotates with a rotation of rotor blades 208 to generate a wind turbine generator output signal 442. Wind turbine generator output signal 442 is an example of wind turbine output signal 116.

Controller 304 synchronizes 528 wind turbine 102 with grid generator 410. Controller 304 performs synchronization 528 by operating the wind turbine generator 312 at the same frequency and voltage as that of grid generator 410 and by aligning a voltage of a single-phase connection 434 of grid generator 410 with a voltage of single-phase connection 418, a voltage of a single-phase connection 436 of grid generator 410 with a voltage of single-phase connection 422, and a voltage of a single-phase connection 438 of grid generator 410 with a voltage of single-phase connection 426. As an example, controller 304 includes a frequency converter that determines a frequency of a voltage of a grid generator output signal 440 and sends a signal to the rotor of wind turbine generator 312 to operate at the frequency. The frequency converter sends a signal to the rotor of wind turbine generator 312 so that a voltage of wind turbine generator output signal 442 generated by a stator of wind turbine generator 312 is equal to and in phase with a voltage of grid generator output signal 440.

Wind turbine generator 312 outputs wind turbine generator output signal 442 to grid transformer 404. Grid transformer 404 steps-up a low voltage of wind turbine generator output signal 442 to a voltage higher than the low voltage and the higher voltage is generated at a secondary winding of grid transformer 404. Grid transformer 404 steps-up a low voltage and outputs a grid transformer output signal 444. Load 406 receives grid transformer output signal 444 and operates, such as, generates heat, to generate a load output signal 446. As an example, load output signal 446 is generated from a current that flows through a first and a second bank of resistors.

The user allows 530 load 406 to operate for a predetermined period of time, such as, ranging from and including five to ten minutes. During operation 530 of load 406, a power of load output signal 446 is measured by power meter 408. Power meter 408 measures a power of load output signal 446 to generate a power meter output signal 448. Moreover, during operation of load 406, power meter 402 measures a power output by a wind turbine generator output signal 448, which is the same as wind turbine generator output signal 442. The user monitors 532 power meters 402 and 408 to determine that each of wind turbine generator output signal 448 and load output signal 446 have a power, such as, ranging from and including 10 kWh (kilowatt hour) to 20 kWh, which is sufficient to obtain a federal production tax credit. The user records within a memory device values of powers of wind turbine generator output signal 448 and load output signal 446.

The user stops 534 operating wind turbine 102 in the same manner in which the user stops 502 operating wind turbine 102. The user changes 536 the parameter of wind turbine 102 back to the original value to restore a power output of wind turbine generator 312 to a plurality of values, such as 1 MW, 2.3 MW, 2.5 MW, 2.7 MW, or alternatively 3.6 MW. For example, the user inputs into controller 304 a frequency, having the original value, of rotation of a rotor within wind turbine generator 312. Controller 304 supplies a signal to the rotor to rotate at the frequency, having the original value, input by the user. As another example, the user changes a pitch of rotor blades 208 to the original value by providing the original value to controller 304. Controller 304 sends a signal with the additional value to blade pitch drive 306 and blade pitch drive 306 drives rotor blades 208 to change a pitch of rotor blades 208 to the original value, such as, ranging from and including 85 degrees to 95 degrees.

The user also stops 536 operation of grid generator 410 by turning off the switch of grid generator 410. The user disconnects 540 grid generator 410 from wind turbine 102 by decoupling single-phase connections 418, 422, 426, 428, 430, and 432 and ground connections between grid transformer 404 and wind turbine generator 312. For example, the user decouples single-phase connection 418 from single-phase connection 428, single-phase connection 422 from single-phase connection 430, single-phase connection 426 from single-phase connection 432, and a ground connection of grid transformer 404 from a ground connection of wind turbine generator 312. The user couples 542 pad transformer 106 with wind turbine generator 312. For example, the user connects single-phase connection 416 with single-phase connection 418, single-phase connection 420 with single-phase connection 422, single-phase connection 424 with single-phase connection 426, and a ground connection of pad transformer 106 with a ground connection of wind turbine generator 312. The user starts 544 wind turbine 102 in the same manner the user starts 526 wind turbine 102.

Technical effects of the herein described systems and methods for testing a wind turbine include saving time of testing wind turbine 102 by using grid simulator 104. The user does not wait to test wind turbine 102 until POI substation 108 is constructed and energized. As a result, a late delivery of wind turbine 102 to a customer is avoided and costs of the late delivery are saved. Other technical effects include scheduling flexibility for scheduling a test of wind turbine 102 and an expedited process of the test. By measuring a power of load output signal 446 and a power of wind turbine generator output signal 442, and by determining that a voltage of load output signal 446 and wind turbine generator output signal 442 are sufficient to achieve the federal production tax credit, a converter commissioning test (CCT) of wind turbine 102 is performed.

While the invention has been described in terms of various specific embodiments, those skilled in the art will recognize that the invention can be practiced with modification within the spirit and scope of the claims.

What is claimed is:

1. A system for testing, said system comprising:
a wind turbine comprising a wind turbine generator; and
a grid simulator comprising:
   a grid generator configured to generate power and operatively coupled to said wind turbine; and
   a portable load coupled to said grid generator.

2. A system in accordance with claim 1 further comprising a grid transformer coupled to said grid generator, said portable load, and said wind turbine, and configured to convert a first voltage into a second voltage.

3. A system in accordance with claim 1 further comprising a power meter coupled to said grid generator and configured to measure a power output by said portable load.

4. A system in accordance with claim 1 further comprising a power meter configured to measure power output by said wind turbine generator.

5. A system in accordance with claim 1 further comprising a vehicle attached to a trailer and configured to transport said portable load on said trailer.

6. A system in accordance with claim 1 wherein said wind turbine is synchronized with said grid generator by a controller of said wind turbine.

7. A system in accordance with claim 1 wherein said portable load configured to operate by receiving power output from said wind turbine that is synchronized with said grid generator, and said system further comprises a power meter configured to test a power output by said portable load to determine whether the power output by said portable load is within a pre-determined range.

8. A system in accordance with claim 1 further comprising a power meter configured to test a power output of a wind turbine generator of said wind turbine to determine whether the power output lies within a pre-determined range.

9. A system in accordance with claim 1 wherein said wind turbine generator provides power to said portable load for a pre-determined amount of time.

10. A system for testing, said system comprising:
a wind turbine comprising a wind turbine generator; and
a grid simulator comprising:
   a portable generator configured to generate power and operatively coupled to said wind turbine; and
   a portable load coupled to said portable generator.

11. A system in accordance with claim 10 further comprising a portable transformer coupled to said portable generator, said portable load, and said wind turbine, and configured to convert a first voltage into a second voltage.

12. A system in accordance with claim 10 further comprising a power meter coupled to said portable generator and configured to measure a power output by said portable load.

13. A system in accordance with claim 10 further comprising a power meter configured to measure power output by said wind turbine generator.

14. A system in accordance with claim 10 further comprising a vehicle attached to a trailer and configured to transport said portable load and said portable generator on said trailer.

15. A system in accordance with claim 10 wherein said wind turbine is synchronized with said portable generator by a controller of said wind turbine.

16. A system in accordance with claim 10 wherein said portable load configured to operate by receiving power output from said wind turbine that is synchronized with said portable generator, and said system further comprises a power meter configured to test a power output by said portable load to determine whether the power output by said portable load is within a pre-determined range.

17. A method for testing, said method comprising:
coupling a grid simulator to a wind turbine comprising a wind turbine generator, the grid simulator operatively coupled to the wind turbine, the grid simulator comprising a grid generator and a portable load; and
coupling the portable load to the grid generator.

18. A method in accordance with claim 17 further comprising coupling a grid transformer to the grid generator, the portable load, and the wind turbine.

19. A method in accordance with claim 17 further comprising:
coupling a power meter to said grid generator; and
measuring, by the power meter, a power output by the portable load.

20. A method in accordance with claim 17 further comprising measuring power output by a wind turbine generator of the wind turbine.

* * * * *